(12) United States Patent
Arene et al.

(10) Patent No.: US 11,209,799 B2
(45) Date of Patent: Dec. 28, 2021

(54) METHOD FOR INSERTING A WIRE INTO A GROOVE OF A SEMICONDUCTOR CHIP

(71) Applicant: PRIMO1D, Grenoble (FR)

(72) Inventors: Emmanuel Arene, Biviers (FR); Robin Lethiecq, Grenoble (FR); Pavina Nguyen, Grenoble (FR); Christopher Mackanic, Le Versoud (FR)

(73) Assignee: PRIMO1D, Grenoble (FR)

( * ) Notice: Subject to any disclaimer, the term of this patent is extended or adjusted under 35 U.S.C. 154(b) by 130 days.

(21) Appl. No.: 16/481,754

(22) PCT Filed: Jan. 25, 2018

(86) PCT No.: PCT/FR2018/050166
§ 371 (c)(1),
(2) Date: Jul. 29, 2019

(87) PCT Pub. No.: WO2018/138437
PCT Pub. Date: Aug. 2, 2018

(65) Prior Publication Data
US 2019/0391560 A1    Dec. 26, 2019

(30) Foreign Application Priority Data
Jan. 30, 2017    (FR) ...................................... 1750728

(51) Int. Cl.
*G05B 19/4097*    (2006.01)
*G06K 19/077*    (2006.01)

(52) U.S. Cl.
CPC ... *G05B 19/4097* (2013.01); *G06K 19/07775* (2013.01); *G05B 2219/45031* (2013.01)

(58) Field of Classification Search
CPC ................ D02G 3/441; D10B 2401/18; D10B 2403/02431; G05B 19/4097;
(Continued)

(56) References Cited

U.S. PATENT DOCUMENTS 8,093,617 B2    1/2012    Vicard et al.
8,471,713 B2    6/2013    Poeze et al.
(Continued)

FOREIGN PATENT DOCUMENTS

EP    2339618 B1    6/2011
EP    2429006 A3    3/2012
(Continued)

OTHER PUBLICATIONS

International Search Report for International Application No. PCT/FR2018/050166 dated Apr. 12, 2018, 3 pages.
(Continued)

*Primary Examiner* — Minh N Trinh
(74) *Attorney, Agent, or Firm* — TraskBritt

(57) ABSTRACT

A method for inserting a wire into a longitudinal groove of a semiconductor chip for the assembly thereof, the groove containing a pad made of a bonding material having a set melting point, comprises: in a positioning step, placing a longitudinal section of the wire along the groove, in forced abutment against the pad; and, in an insertion step, exposing a zone containing at least one portion of the pad to a processing temperature higher than the melting point of the bonding material and for a sufficient time to make the pad at least partially melt, and causing the wire to be inserted into the groove. The present disclosure also relates to a piece of equipment allowing the insertion method to be implemented.

11 Claims, 4 Drawing Sheets

(58) Field of Classification Search
CPC ....... G05B 2219/45031; G06K 19/027; G06K 19/07775; H01L 2224/48137
See application file for complete search history.

(56) References Cited

U.S. PATENT DOCUMENTS

| | | |
|---|---|---|
| 8,471,773 B2 | 6/2013 | Vicard et al. |
| 8,723,312 B2 | 5/2014 | Brun et al. |
| 8,782,880 B2 | 7/2014 | Vicard et al. |
| 8,814,054 B2 | 8/2014 | Brun et al. |
| 9,888,573 B2* | 2/2018 | Vicard ................... H05K 1/181 |
| 2006/0177965 A1* | 8/2006 | Senda ............... H01L 23/49811 |
| | | 438/108 |
| 2009/0227069 A1* | 9/2009 | Brun ................... H01L 21/6835 |
| | | 438/113 |
| 2015/0230336 A1 | 8/2015 | Vicard et al. |
| 2015/0318409 A1 | 11/2015 | Vicard et al. |
| 2019/0391560 A1* | 12/2019 | Arene ................... G06K 19/027 |
| 2021/0064671 A1* | 3/2021 | Ramraj ............... H04L 61/1511 |

FOREIGN PATENT DOCUMENTS

| | | |
|---|---|---|
| WO | 2009/112644 A1 | 9/2009 |
| WO | 2014/041107 A1 | 3/2014 |

OTHER PUBLICATIONS

International Written Opinion for International Application No. PCT/FR2018/050166 dated Apr. 12, 2018, 11 pages.

\* cited by examiner

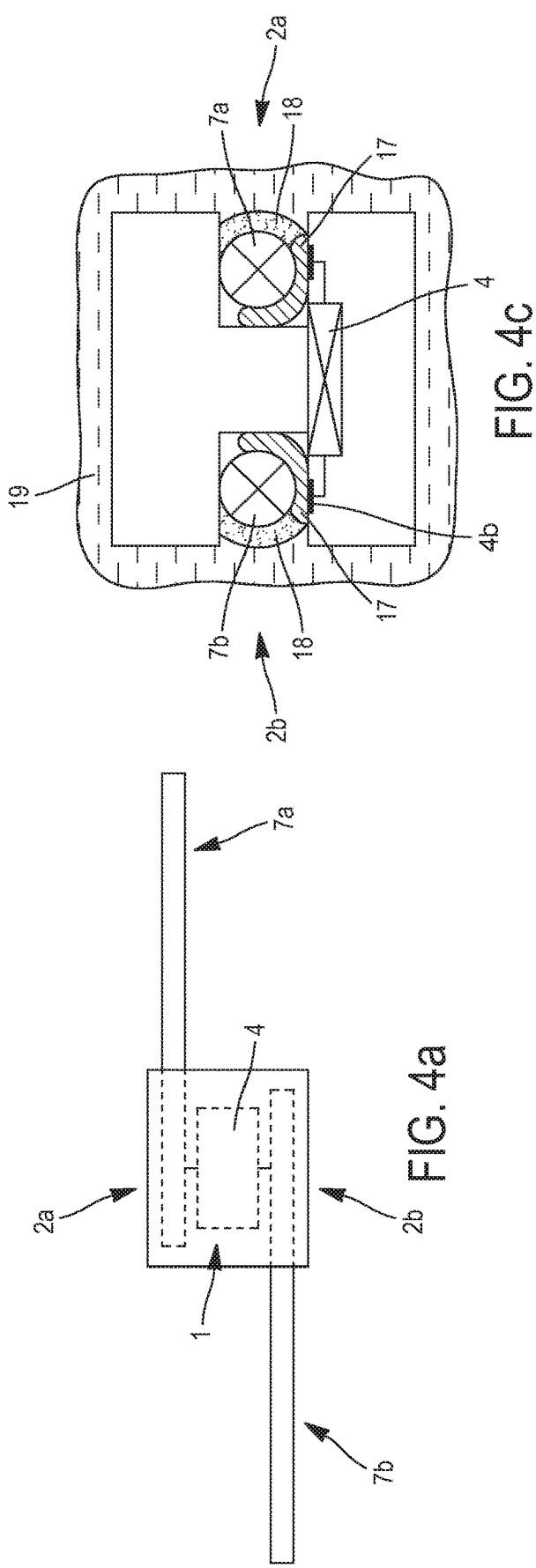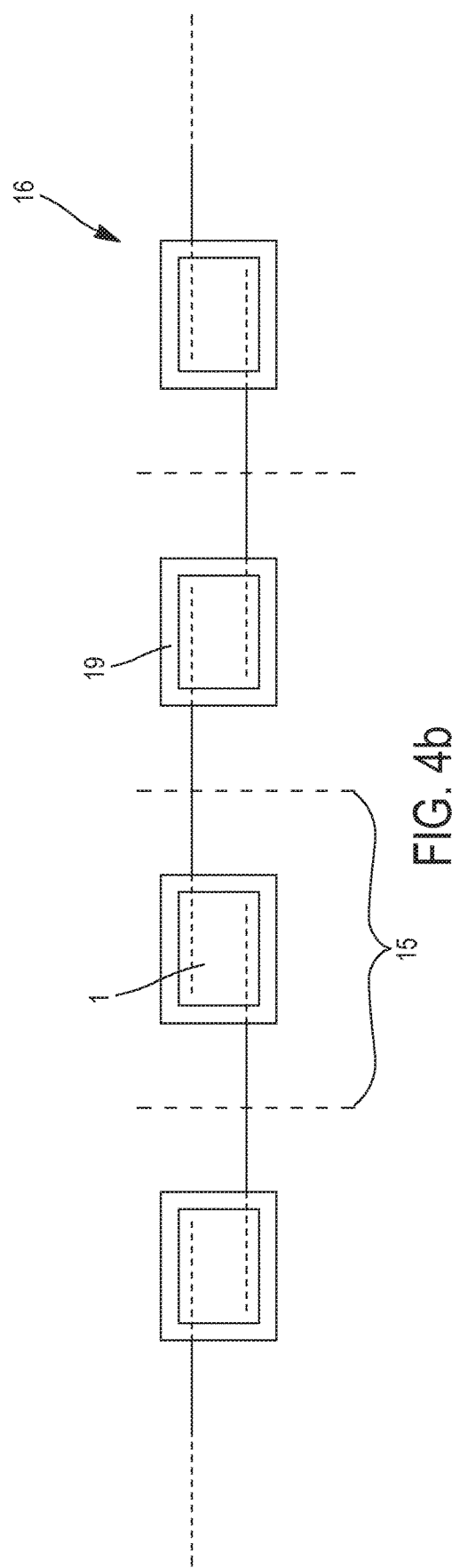

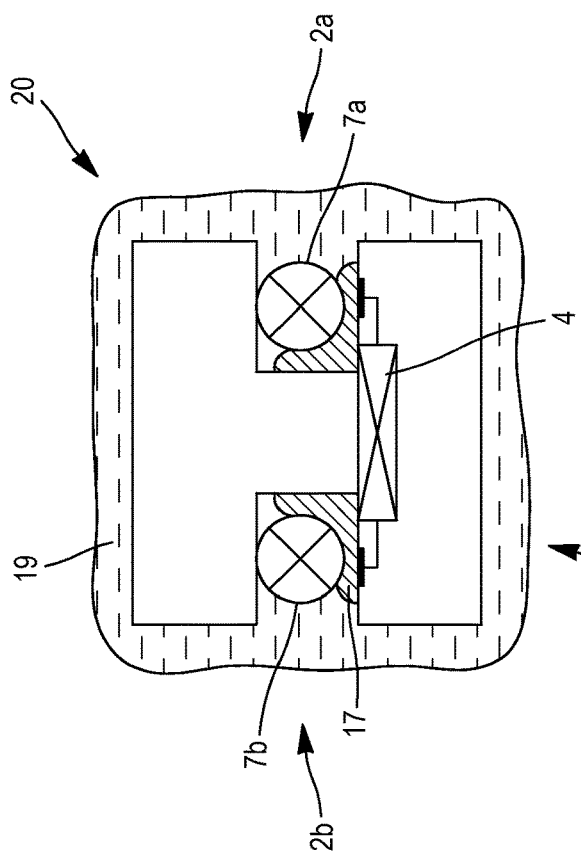
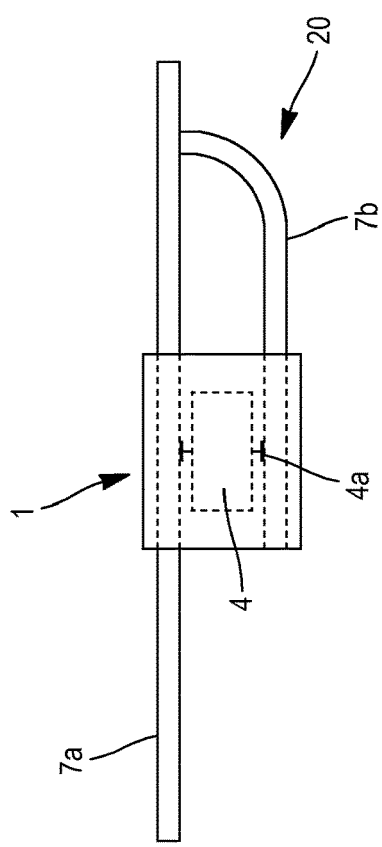
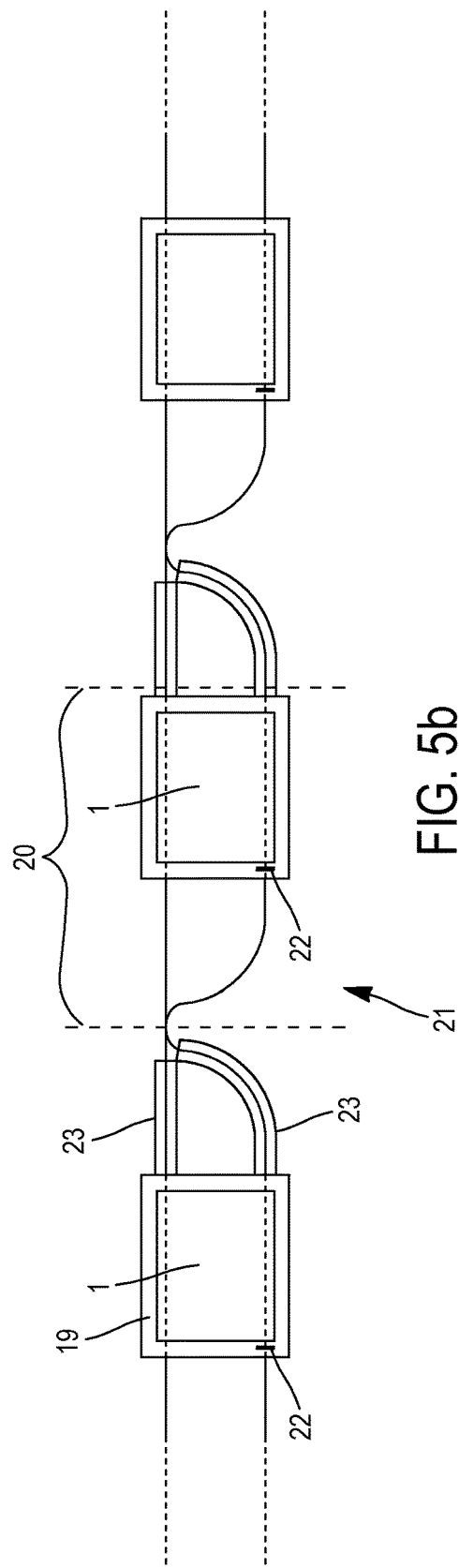
FIG. 5a
FIG. 5b
FIG. 5c

METHOD FOR INSERTING A WIRE INTO A GROOVE OF A SEMICONDUCTOR CHIP

CROSS-REFERENCE TO RELATED APPLICATIONS

This application is a national phase entry under 35 U.S.C. § 371 of International Patent Application PCT/FR2018/050166, filed Jan. 25, 2018, designating the United States of America and published as International Patent Publication WO 2018/138437 A1 on Aug. 2, 2018, which claims the benefit under Article 8 of the Patent Cooperation Treaty to French Patent Application Serial No. 1750728, filed Jan. 30, 2017.

TECHNICAL FIELD

The present disclosure relates to a method for inserting a wire into a groove of a semiconductor chip for assembly thereof. It also relates to a piece of equipment implementing this insertion method. It finds an exemplary application in the field of RFID electronic tagging ("Radiofrequency Identification") to directly associate an antenna with a transmission reception chip and provide a particularly small radiofrequency device that is simple to manufacture. This device can be integrated into a textile thread and this thread itself can be integrated into a wide variety of objects for the identification, tracking, and administration thereof.

BACKGROUND

For example, the technology used to assemble a wire and a chip known as E-THREAD™ is known from the documents U.S. Pat. Nos. 8,471,713, 8,093,617, 8,093,617, 8,723,312, US2015318409, U.S. Pat. Nos. 8,782,880, 8,814,054 or US2015230336.

With this technology, the chip has a longitudinal groove and a longitudinal section of the wire is inserted into this groove. The assembly can be obtained by embedding the wire in the groove, the dimensions of the wire and of the groove then being sufficiently adjusted to mechanically join the two elements to each other. As disclosed in the documents WO2009112644 and WO2014041107, the groove may in some cases be provided with a pad making it possible to clamp the wire in the groove, so as to hold it there. In addition or alternatively, the assembly can be obtained or reinforced by adding an adhesive material between the wire and the chip, by soldering or brazing the wire and the chip.

In the document U.S. Pat. No. 8,471,773, the wire is electrically conductive and the semiconductor chip contains a transmission reception circuit. The assembly of the wire and the chip makes it possible to contact the wire and an input-output terminal of the transmission reception circuit to form an operational transmission reception device. The wire is an antenna of this device.

Inserting the wire into the chip groove is a particularly delicate operation, especially in an industrial context where it is necessary to be able to maintain a high production rate.

Document U.S. Pat. No. 8,782,880 discloses a piece of insertion equipment adapted to maintain this rate. Large wires are supplied in the piece of equipment in the form of coils and the chips stored in a tank. Two wires are unwound from the coils to be supplied, parallel to each other, to a clamping zone of the piece of equipment. It is also configured to successively bring the chips from the tank to this clamping zone, between the two wires, and embed a longitudinal section of each wire in a longitudinal groove of the chip. Alternatively, this document provides for the welding of the wire and a metal pad placed in the groove to each other to secure the chip and the wire at the outlet of the insertion piece of equipment. A chain is thus formed that consists of a plurality of chips connected by large wires. The chip chain can be wound on a support to form a storage reel. Segments of this chain can be removed from the storage reel by cutting the wires according to a desired cutting pattern.

The insertion technology provided for in this piece of equipment requires the application of relatively significant efforts on the wires to embed them in the grooves. This "forced" insertion of the wire into the groove can lead to weakening or breaking during or after the insertion. In addition, this insertion technology is particularly sensitive to the correct adjustment of the groove and the wire dimensions. A wrong adjustment may lead to an insufficiently robust assembly, or on the contrary, require excessive force that may lead to the breakage of, or damage to the wire.

It would be advantageous to have an insertion technique that does not require the application of as much effort as the state of the art. It would also be advantageous to be able to insert and assemble the wire and the chip in the same step, without excessive effort.

BRIEF SUMMARY

With a view to achieving at least one of these purposes, the subject matter of the present disclosure proposes, according to a first aspect, a method for inserting a wire into a longitudinal groove of a semiconductor chip for the assembly thereof, the groove containing a pad made of a bonding material having a set melting point, the method comprising:
in a positioning step, placing a longitudinal section of the wire along the groove, in forced abutment against the pad; and
in an insertion step, exposing a zone containing at least one portion of the pad to a processing temperature higher than the melting point of the bonding material and for a sufficient time to make the pad at least partially melt, and causing the wire to be inserted into the groove.

According to other advantageous and unrestrictive characteristics of the present disclosure, taken alone or in any technically feasible combination:
the method comprises, upon completion of the insertion step, solidifying the bonding material to assemble the wire and the chip;
the wire is maintained in a state of tension opposite the groove and the positioning step consists in pressing the wire against the pad;
the pad is brought to the induction processing temperature by exposing the zone to a hot air flow or a light flow;
the method comprises, before or during the positioning step, a step of preparing the longitudinal section of the wire intended to be inserted into the groove;
the preparation step comprises the deposition of a coating layer on the longitudinal section of the wire;
the preparation step includes a step of cleaning and/or deoxidation of the longitudinal section of the wire;
the insertion step is followed by a reinforcing step comprising dispensing an adhesive in the groove and on the longitudinal section of the wire exposed in the groove;
the insertion step is followed by a step of encapsulating the chip and/or wires;
the wire is electrically conductive; and the method comprises repeating the positioning and inserting steps so as to insert a plurality of chips onto the wire and form a chain 16, 21.

In another aspect, the present disclosure also proposes a piece of equipment for inserting a wire into at least one chip, the chip having a groove to receive a longitudinal section of the wire and the groove containing a pad made of a bonding material having a set melting point, the piece of equipment comprising:

positioning members for deploying and moving a length of the wire between a first and a second end of a workspace;

a device for handling the chip capable of placing the chip in an insertion position in which the groove is placed opposite the wire;

a positioning member for arranging the longitudinal section of the wire along the groove, in forced abutment against the pad; and a heating member for raising to a processing temperature a zone comprising the pad when the chip is placed in the insertion position.

According to other advantageous and unrestrictive characteristics of the present disclosure, taken alone or in any technically feasible combination:

the positioning members are configured to deploy two parallel wires between the first and the second ends, and wherein the insertion position is located between the two wires;

the insertion equipment has at least one additional member arranged in the workspace, downstream or upstream of the chip insertion position; and the additional member and the positioning member are positioned and configured in the workspace so that the processing performed by these components can be conducted simultaneously.

BRIEF DESCRIPTION OF THE DRAWINGS

Other characteristics and advantages of the present disclosure will emerge from the detailed description of the present disclosure that follows with reference to the appended figures on which:

FIGS. 4a to 4c show an exemplary application of the method to the manufacturing of a first reception transmission device; and FIGS. 5a to 5c show an exemplary application of the method of the present disclosure to the manufacturing of a second transmission reception device.

DETAILED DESCRIPTION

Figure 1B:
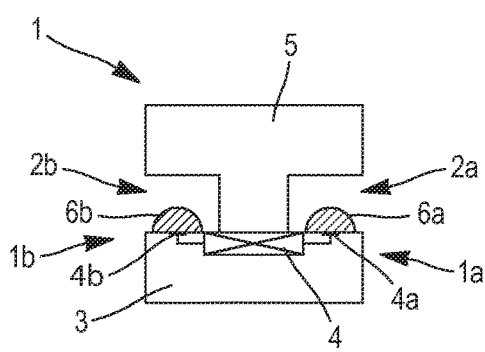
FIGS. 1a and 1b represent, in perspective and in cross-section, a chip compatible with an insertion method according to the present disclosure.
Figure 1A:
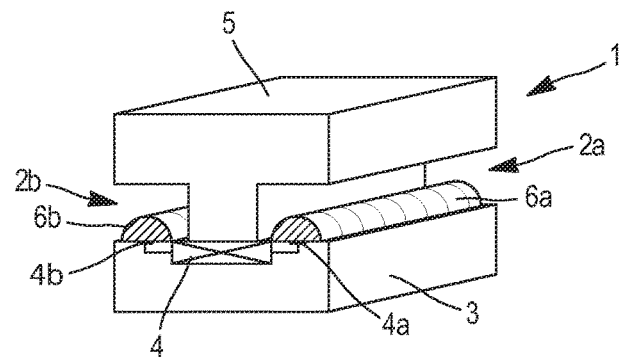

FIG. 1a shows, in perspective, an electronic component, referred to as a "semiconductor chip" 1, or more simply a "chip" in the following description, compatible with an insertion method according to the present disclosure. FIG. 1 is a cross-sectional view of such a chip 1.

The chip 1 has two longitudinal grooves 2a, 2b, parallel to each other and respectively formed on two side faces 1a, 1b of the chip 1, opposite each other. This configuration makes it possible to keep all its generality to the description that follows, but the present disclosure is by no means limited to this number and this arrangement of grooves, and the chip 1 can quite well be provided with a single or any number of groove(s), each arranged in any orientation on any one of the faces of the chip 1, without leaving the scope of the present disclosure. These longitudinal grooves 2a, 2b are provided each to receive and accommodate a longitudinal section of a wire (not shown in these FIGS. 1a and 1b). To facilitate the insertion of the wire, each groove 2a, 2b extends, on the face of the chip that it is placed on, from one side to the other of the chip 1. In the following, the portion of the wire that is or will be accommodated in a groove of the chip, depending on its length, is referred to as the "longitudinal section of the wire".

According to the present disclosure, the height and depth dimensions of the grooves 2a, 2b are chosen large enough, or the wire cross-section is chosen small enough, so that each wire can be accommodated in a groove 2a, 2b without mechanically forcing its embedding. To promote the connection of the wire to the chip 1, it is generally preferable, for the longitudinal section of the wires to be able to be fully accommodated in the grooves, i.e., the accommodated portion of each wire does not extend beyond the face of the chip that the groove is formed on. When the chip 1 has a plurality of grooves 2a, 2b as in FIGS. 1a and 1b, they are not necessarily of the same size. Similarly, the wires that are to be accommodated in the grooves are not necessarily of the same nature and do not necessarily have identical cross-sections.

The chip 1 comprises a substrate 3 having a functional circuit 4, such as a transmission reception circuit, a calculation device, a sensor, a LED or any other form of integrated circuit provided on the substrate 3, for example, using techniques known in the semiconductor field. The functional circuit 4 can be electrically connected to one or more connection terminal(s) 4a, 4b leading into either one of the grooves 2a, 2b using conductive tracks or vias formed on or in the substrate 3. At least one of the wires can then be brought into electrical contact when it is inserted into one of the grooves 2a, 2b with the functional circuit 4. In this case, the wire assembled to the chip 1 is not a simple mechanical support for the chip 1, but can contribute to the operation thereof, for example, by forming an antenna, or by electrically connecting the chip to a power supply, or still by distributing a signal to another chip that would also be connected thereto. In this case, of course, the wire is made of, or includes an electrically conductive material. If the wire is provided with an insulating sheath, it may be necessary to strip the wire at its longitudinal section to be accommodated in the groove in order to enable an electrical contact with a connection terminal. But the present disclosure is by no means limited to an electrical conductive wire connected to a connection terminal located in a groove of the chip 1. It can be envisaged that the wire will be made of a non-conductive material that forms a mechanical support for this chip. Alternatively, the chip may be provided with a plurality of wires arranged in grooves, at least one wire being a metal conductor electrically connected to the chip 1, at least another wire being an electrical insulator and being used only as a support.

In the description of FIGS. 1a and 1b, the chip 1 also includes a cover 5, with a T-shaped section, the base of the T being assembled with a main face of the substrate 3. In this way, the two longitudinal grooves 2a, 2b are formed between the T-bar of the cover 5 and the main surface of assembly with the substrate 3. Like the substrate 3, the cover 5 can also be provided with a functional circuit, connection terminals and/or conductive tracks or vias. These elements can be electrically and functionally connected to the functional circuit 4.

Other configurations of the chip 1 than the one shown in the figures below and 1b are possible. For example, the chip 1 may consist of a single flat support having the functional circuit 4, the longitudinal grooves 2a, 2b being formed, for example, by etching, on two opposite lateral faces of this support, or on one and/or the other of the main faces of this support. According to another configuration, the chip 1 can consist of two flat supports of identical or similar dimensions, each having a functional circuit. The flat supports are each assembled to the two opposite sides of a smaller spacer to define the two longitudinal grooves 2a, 2b of the chip 1. The spacer can consist of a part made up of a sufficiently thick layer of adhesive.

Whatever the configuration chosen, a chip 1 compatible with an insertion method according to the present disclosure shall have at least one longitudinal groove 2a, 2b for receiving and accommodating a longitudinal section of a wire.

Also according to the present disclosure, the groove 2a, 2b contains at least one pad 6a, 6b made of a bonding material. In the example shown in FIGS. 1a, 1b the pads 6a, 6b are arranged in the grooves 2a, 2b on the face of the cover 5 forming one of the walls of the grooves 2a, 2b, and over their whole length. Alternatively, the pads 6a, 6b could be placed on another wall forming the grooves 2a, 2b, for example, on the cover 5 side. Alternatively, each pad 6a, 6b of a plurality of elementary pads, distinct from each other, arranged in a groove over a reduced length, could be chosen. Whatever the shape, volume or arrangement of the pads 6a, 6b in the grooves 2a, 2b, they are so large that it is not possible to perfectly accommodate the wires in the grooves 2a, 2b in their presence. As will be made explicit in the following description, each pad 6a, 6b forms a reserve of a bonding material that will allow the assembly and good mechanical strength of the wire accommodated in each of the grooves 2a, 2b.

The material constituting each pad 6a, 6b is chosen so that its melting point is relatively low. This melting point is lower than the maximum temperature that the functional circuit 4 of the chip 1 can be exposed to without damage. If, for example, this maximum temperature is 350° C., the material of the pads 6a, 6b should be chosen so that its melting point is lower than 350° C., for example, 300° C. Advantageously, for reasons of simplicity of the insertion method described below, this material is chosen so that its melting point is between 80° C. and 100° C. or 150° C., or 250° C. The material constituting each pad 6a, 6b may include a plurality of elemental compounds. For example, it may be an alloy of metals, such as tin, silver and copper. It should be noted that the chip 1 is intended to be handled at atmospheric pressure, and therefore the mentioned melting point is determined at this pressure. In addition, it is not necessary for all the pads 6a, 6b or elementary pads to be made of the same material.

Advantageously, especially when a pad 6a, 6b is used to electrically connect a wire to a connection terminal of the chip 1, it is made of an electrically conductive material. But, as noted above, this is not compulsory.

The chip 1 can be mass-produced, using technologies of the semiconductor integrated circuits field, as taught in the mentioned state-of-the-art documents. The pads 6a, 6b can be advantageously manufactured during the manufacture of the chip 1, for example, by forming them by deposition on the substrate 3 before the assembly thereof with the cover 5 or, more generally before the formation of the cover 5. It is also possible to consider forming the pads 6a, 6b in the longitudinal grooves 2a, 2b after manufacturing the chip 1, for example, by dispensing the bonding material forming these pads 6a, 6b in a liquid form, at a temperature above its melting point, directly into the grooves 2a, 2b.

The present disclosure takes advantage of the characteristics of the chip 1 to propose a particularly clever method for inserting at least one wire into at least one groove 2a, 2b of the chip 1 that does not require a forced embedding of this wire, and therefore limits the forces applied to the wire during its insertion. This method is described while referring to FIGS. 2a to 2e.

First of all, it should be noted that the wire can be of any kind as long as it is sufficiently resistant to the mechanical and chemical treatments that will be disclosed. Advantageously, the wire is a conductive electrical wire, for example, made of stainless steel, a copper-based alloy or copper, and the insertion method allows this wire to be electrically connected to a terminal 4a, 4b of the functional circuit 4 of the chip 1.

Figure 2A:
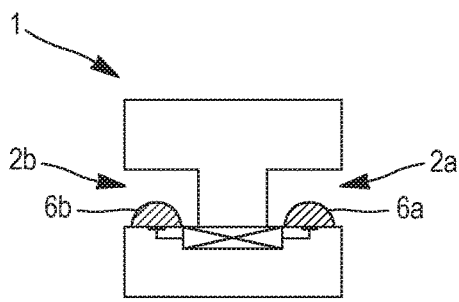
FIGS. 2a to 2e show the steps of a method according to the present disclosure.

FIG. 2a shows a chip 1 as described above.

Figure 2B:
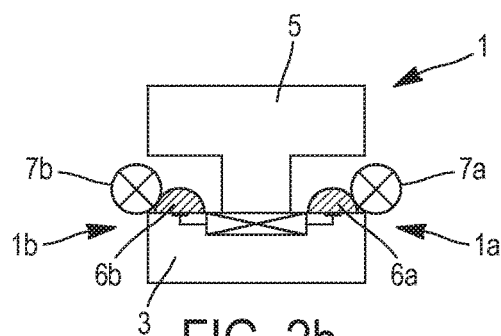

During a positioning step, a longitudinal section of two wires 7a, 7b is laid out along two grooves 2a, 2b. The pad 6a, 6b occupies a sufficient portion of the groove 2a, 2b to prevent the wire from being fully accommodated therein. During the positioning step, limited efforts are made on the wire 7a, 7b to press it against the pad 6a, 6b and put it in forced abutment against it. FIGS. 2b and 2c show the chip 1 and two wires 7a, 7b upon completion of the positioning step. The wires 7a, 7b are in contact with the pads 6a, 6b, they can also be in contact with one of the edges of the substrate 3 and/or the cover 5 defining the contours of the grooves 2a, 2b on the side faces 1a, 1b of the chip 1. In the case where a pad 6a, 6b does not extend over the full length of a groove 2a, 2b, a portion of the longitudinal section of a wire may be partially accommodated therein.

It should be remembered that the diameter of the wires is chosen to be smaller than the height of the grooves, so that in the absence of the pads 6a, 6b, the wires can be inserted without any particular embedding effort and be accommodated in the grooves 2a, 2b.

Figure 2D:
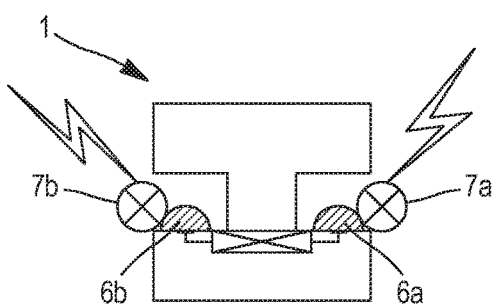
Figure 2C:
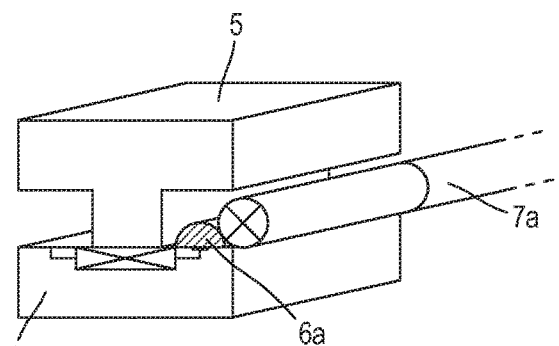
Figure 2E:
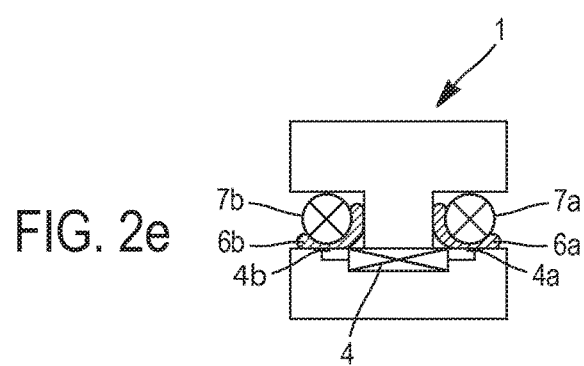

As shown in FIGS. 2d and 2d, the method of the present disclosure also includes an insertion step, subsequent to the positioning step. During this insertion step, a zone at least partially comprising the pads 6a, 6b is exposed to a processing temperature above the melting point of the bonding material they contain, and for a sufficient time to melt it. The change to the liquid state of the bonding material, combined with the modest forces exerted on the wires 7a, 7b, leads to the insertion of the latter into the grooves 2a, 2b as shown in FIG. 2e. It is not necessary for the bonding material of the pads 6a, 6b to pass in its entirety to the liquid state to cause the insertion of the wires 7a, 7b. It is sufficient that only a portion of the material liquefies to clear a sufficient passage to allow the wires 7a, 7b to be engaged and accommodated in the grooves 2a, 2b. The zone exposed to the processing temperature includes all the pads 6a, 6b, but only a portion of these pads 6a, 6b may directly be exposed to the processing temperature that can be caused by heat conduction.

When the chip 1 has several grooves 2a, 2b to accommodate several wires 7a, 7b, as shown in the example shown in FIGS. 2a to 2e, the insertion step can be performed successively or simultaneously for each of the wires. The zone exposed to the processing temperature may be large enough to at least partially include all the pads 6a, 6b. Alternatively, the insertion step may include the simultaneous or successive exposure of several distinct zones, each encompassing at least a portion of the pads 6a, 6b.

The insertion step can be carried out with a heating member, for example, a generator of a flow of air or another heated fluid, by induction, or by light irradiation such as laser irradiation or ultraviolet radiation, leading to the generation of a heat flow defining the heated zone at the chip 1. The flow is maintained for long enough and has a sufficient temperature, higher than the melting point of the bonding material the pad 6a, 6b is made of, to cause it to melt. Of course, the heating can be global, for example, by placing the chip 1 in a heated enclosure, but this approach could be a little more complex to implement industrially.

As shown in FIG. 2e, the bonding material constituting the pads 6a, 6b, once in the liquid state, tends to embed itself around the wire 7a, 7b, and flow over the walls defining the grooves 2a, 2b. Some of the bonding material can be absorbed by the longitudinal section of the wire and contributes to reinforcing the mechanical strength of the wire 7a, 7b in the grooves 2a, 2b.

When the wires 7a, 7b are inserted into the grooves 2a, 2b, the heat treatment of the bonding material can be interrupted either by deactivating the heating member or by moving the chip 1 and/or the member so as to extract the chip 1 from the zone exposed to the heat flow. The interruption of the heat treatment in the zone restores a temperature lower than the melting point of the bonding material, typically at room temperature, which leads to a solid constitution and to the wire being joined to the chip. When the bonding material and the wires are electrical conductors, it is thus possible to electrically connect the wires 7a, 7b to terminals 4a, 4b of the functional circuit 4. It should therefore be noted that the method makes it possible, in a combined way, to insert the wire and secure it to the chip 1 without the need for major embedding efforts. The pad 6a, 6b forms a kind of reservation of an assembly material, prepositioned in the grooves.

Before or during the positioning step, the method of the present disclosure may provide for a step of preparing the wires 7a, 7b. This step may include removing an insulating sheath surrounding a conductive core, when the wires 7a, 7b are so formed, so that an electrically conductive assembly can be formed with the chip 1. Alternatively, or in addition, a cleaning or deoxidation processing of the wires 7a, 7b can be provided to improve the formation of this contact and/or the adhesion of the pads 6a, 6b bonding material. In some alternative solutions, the preparation step may include tinning the wires or, more generally, coating them with a material that promotes electrical contact or adhesion of the bonding material. These treatments can be carried out, for example, by projecting or spraying liquid fluids or liquefied liquids depending on the desired processing (acid, cleaning solution, liquid metal alloy, etc.).

The method according to the present disclosure may also include additional steps, after the wires 7a, 7b have been inserted into the grooves 2a, 2b, during or after the assembly thereof on the chip 1 by solidifying the bonding material. Thus, the method can include a step of reinforcing the assembly of the wires 7a, 7b on the chip 1. This step is particularly useful when unbalanced forces are applied to a plurality of wires 7a, 7b leading to the formation of shear stresses in their assemblies with the chip 1. The reinforcing step may include dispensing an adhesive into the grooves 2a, 2b and on at least a portion of the longitudinal section of the wires 7a, 7b exposed in the grooves. Dispensing the adhesive can be supplemented by the exposure thereof, for example, by UV treatment, and can be very short, of the order of one second or a few seconds, to stiffen the adhesive and promote the attachment thereof to the elements that it is in contact with.

The method may also include, as a complementary step, a step of encapsulating the chip 1 in a sufficiently rigid and waterproof material, such as resin, to protect it from mechanical or chemical stresses in its final application. Preferably, this encapsulation is such that all the faces of the chip 1, and particularly where the faces which the grooves 2a, 2b have been formed on, are in fact coated with the encapsulating material.

In some cases, especially when the chip 1 is associated with several conductive wires 7a, 7b, it may be necessary to electrically isolate the wires 7a, 7b from each other. The present disclosure may therefore provide for a complementary step aimed at providing electrical insulation on or between the wires 7a, 7b. The insulant can be made of a liquid material placed on and between the conductive wires 7a, 7b, or even on the chip 1 itself, before being made solid. Preferably, the electrical insulating material is not excessively rigid in order to keep the wires 7a, 7b deformable, and may be of particular interest depending on the application concerned.

The method may also include, as a complementary step, a step of bringing the wires 7a, 7b into electrical contact in order to form a loop. This contact can result in the dispensing of a conductive adhesive.

The method may also include, as a complementary step, a step of cutting one or more wire(s) 7a, 7b. This may involve taking a segment provided with at least one chip 1 for the integration thereof into an object. It may also involve cutting a portion of a wire to form a dipole antenna connected to the chip 1 as taught in the document U.S. Pat. No. 8,471,773. The cutting of one or more wire(s) 7a, 7b can be carried out by any means known per se, for example, by using a mechanical shearing tool or by laser cutting.

An additional step of testing and/or programming the chip 1 after it has been assembled to the wires 7a, 7b can also be provided to ensure that the previous steps have not affected its functionality and/or make it fully functional.

The present disclosure also provides for a piece of equipment 8 for inserting a wire 7a, 7b into the groove 2a, 2b of a semiconductor chip 1, making it possible to implement a method according to the one just described. The piece of equipment 8 is particularly suitable for the repeated insertion of a wire into a plurality of chips 1, to form a chip chain 1.

Figure 3A:
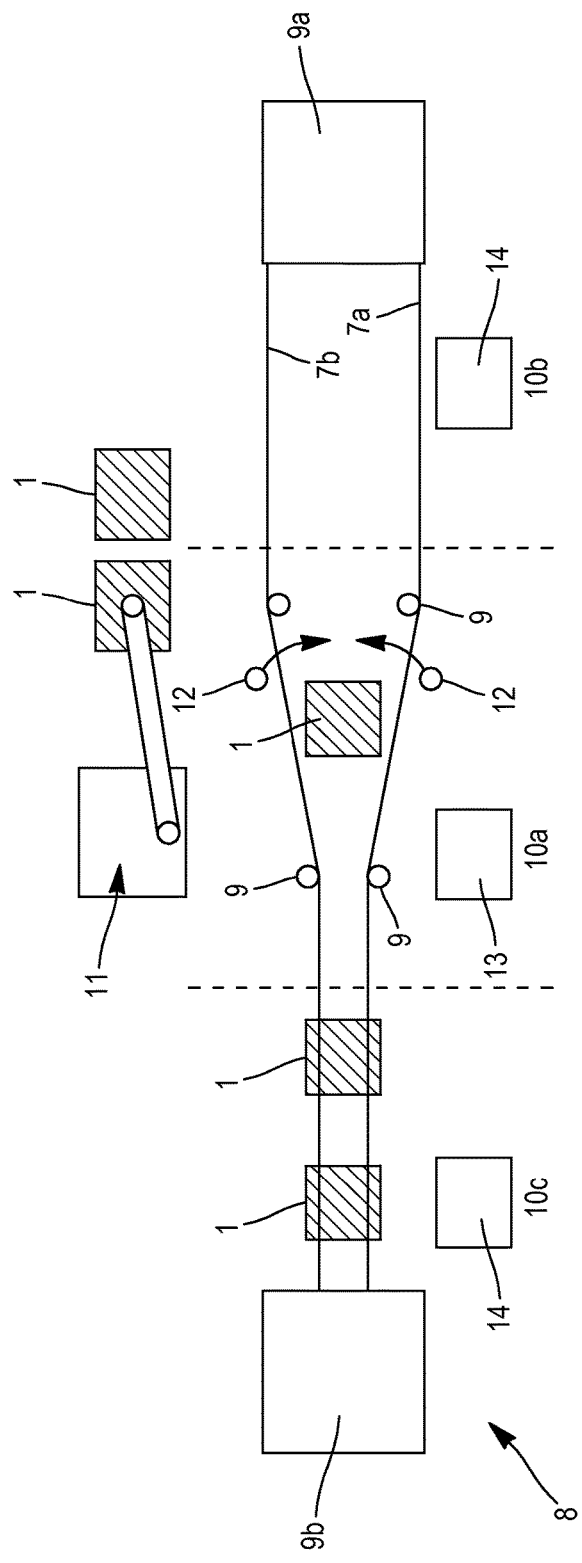
FIGS. 3a and 3b show a piece of equipment configured to implement a method according to the present disclosure at two particular times during its operation.
Figure 3B:
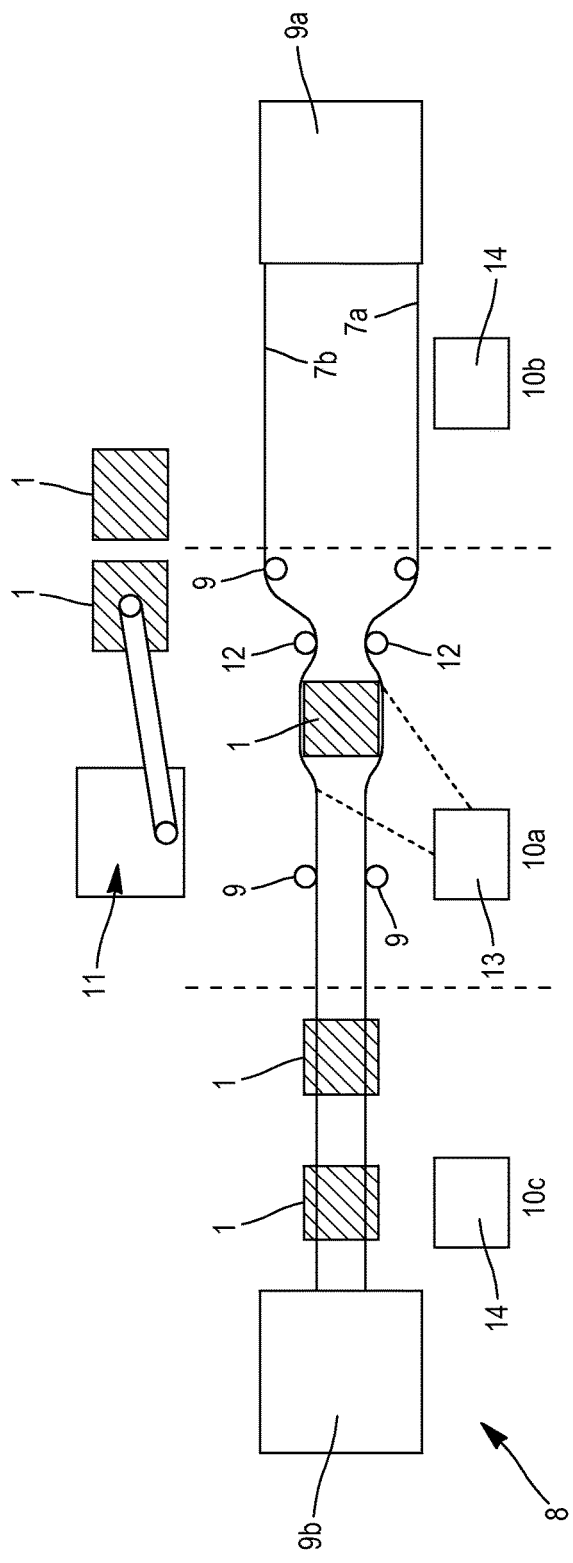

FIGS. 3a and 3b show such piece of equipment at two particular times of its operation. The piece of equipment 8 shown in these figures is configured to allow the simultaneous insertion of two wires 7a, 7b into two grooves 2a, 2b respectively of a chip 1. But the piece of equipment of the present disclosure is by no means limited to this particular example and the same principles that will be explained may apply for the insertion of a different number of wires.

The piece of equipment 8 includes positioning members 9, 9a, 9b to deploy, under a controlled state of tension, a wire 7a, 7b between two ends of a workspace. At one end of this space, a wire supply member 9a, such as a reel, may be provided to extract the two wires 7a, 7b from two supply reels. These wires 7a, 7b are deployed over the entire length of the workspace to reach the second end which a storage member 9b such as a reel can be provided on, making it possible to position the chip chain that will be manufactured by the piece of equipment on a storage reel 8. The wires 7a, 7b are guided between the two ends by guide members 9 such as wheels or rollers to precisely position and guide the position in the space of the wires 7a, 7b, especially during the movements thereof. The positioning members 9a, 9b, 9b, 9 can be motorized to allow the wire to be driven, ensuring, as the piece of equipment 8 processes, the transfer of the wires 7a, 7b from their supply reels to the storage reel.

The positioning members 9, 9a, 9b are also designed to control the tension of each wire 7a, 7b so that it can be between a minimum tension for which the wires 7a, 7b are not tensioned and a maximum tension for which the wires are likely to deteriorate or break. When the piece of equipment 8 is designed to deploy a plurality of wires 7a, 7b, as in the example shown, it may be advantageous to try to maintain the same tension between the two wires. Similarly, when a plurality of wires 7a, 7b are inserted into at least one chip 1, it is important that the movement of the wires 7a, 7b along the workspace during the processing performed by the piece of equipment 8 should be performed simultaneously and with the same speed for each wire 7a, 7b in order to avoid generating shearing forces on the chips 1, which could lead to the disassembling of the wires 7a, 7b from the grooves 2a, 2b.

In the example shown, the two wires 7a, 7b are arranged in the same horizontal plane so that they can be inserted into a chip 1 provided with two grooves 2a, 2b also arranged in the same plane. Another configuration of the grooves 2a, 2b on the chip 1 could lead to a different adjustment of the arrangement of the wires 7a, 7b with respect to each other.

The work space consists of an intermediate zone 10a in which the step of assembling the wires 7a, 7b and the chip 1 is performed.

Upstream of the intermediate zone 10a, on the side of the first end and the supply member 9a, the two wires 7a, 7b are spaced from each other by more than the distance between the two wires 7a, 7b when inserted into the grooves 2a, 2b of the chip 1. When the distance between the grooves 2a, 2b of a chip 1 is less than one millimeter, which is usual, the two wires 7a, 7b can be separated from each other, in the upstream zone 10b, by a few millimeters, for example, 3 mm.

Downstream of the intermediate assembly zone 10a, on the second end of the piece of equipment 8 and storage member 9b side, the wires 7a, 7b are inserted into the grooves 2a, 2b and assembled with the chips 1. The distance between the two wires 7a, 7b is therefore imparted by the geometry of the chip 1 and the depth of its grooves. This distance is typically less than 1 mm.

The guide elements 9 placed in the intermediate zone 10a, or directly in the vicinity of this zone, allow the spacing of the wires 7a, 7b to be guided between the existing spacing in the upstream zone 10b and the one existing in the downstream zone 10c.

The piece of equipment shown in FIGS. 3a, 3b also includes a handling device 11 that allows a chip 1 to be extracted from a chip storage zone and positioned in an insertion position, located in the intermediate zone 10a between the wires 7a, 7b. The insertion position can be materialized by a tray that the chip 1 can be positioned and fixedly held on. When a chip 1 is correctly positioned in the insertion position, the grooves 2a, 2b of the chip are positioned facing and at the same elevation as the wires 7a, 7b and in the same plane. The handling device 11 can be an automatic component insertion ("Pick and Place") machine comprising an articulated arm with a suction nozzle making it possible to grasp a chip 1 from the storage area and position same precisely in the insertion position thereof.

The piece of equipment 8 also includes a member 12 for positioning the wires 7a, 7b. This member 12 placed in the intermediate insertion zone 10a can be supported on the wires 7a, 7b, according to two configurations. In a first "open" configuration, shown in FIG. 3a, the positioning member 12 does not or does not sufficiently rest on the wires 7a, 7b, leaving a space between these wires 7a, 7b clear in order to be able to place a chip 1, therein, in the insertion position. In a second configuration of the positioning member 12, shown in FIG. 3b, the latter is controllably resting to position the wires 7a, 7b along the grooves 2a, 2b, pressed against the pads 6a, 6b placed in these grooves, and therefore in forced abutment against the pads 6a, 6b.

According to the present disclosure, the piece of equipment 8 also includes at least one heating member 13 arranged in or near the intermediate zone 10a, to raise to a processing temperature a zone comprising at least a portion of the pads 6a, 6b arranged in the grooves 2a, 2b, when a chip 1 is placed in the insertion position. As seen in the detailed description of the method of the present disclosure, the heating member 12 allows the temperature of the bonding material forming the pads 6a, 6b to be raised above its melting point. The member 12 may include a generator of a flow of hot air or any other gaseous fluid, a generator of a light radiation such as UV or laser radiation, a generator of induction heating. The member 12 may include several generators, each generator exposing a particular zone, located, for example, in each of the grooves 2a, 2b of a chip 1 when it is placed in the insertion position.

All the members just described may be connected to a processing device, not shown in the figures, ensuring the sequencing of the operations of moving the wires 7a, 7b, placing the chip 1 in the insertion position, actuating the insertion members 12, and the heating member 13 to allow the insertion method of the present disclosure to be carried out at high speed.

In addition to the members arranged in or near the intermediate assembly zone 10a just described, the piece of equipment 8 may also provide, upstream and/or downstream of this zone, other additional members 14 to carry out the steps of preparing the wires 7a, 7b, and the complementary steps on the assembly formed by the chip 1 and the wires 7a, 7b. These additional members may include dispensing nozzles for, for example, spraying cleaning, deoxidation, tin plating or adhesive fluids onto the wires 7a, 7b and/or into the grooves 2a, 2b. The additional members may also include a laser source for cutting a wire or a UV source for solidifying an adhesive or a resin. It can also be a mechanical device for cutting wires by shearing, or chip testing or programming means. Preferably, these additional members 14 make it possible to process the wires 7a, 7b or the chip 1 without contacting these elements.

The additional members 14 are advantageously distributed, in the workspace, along the wires 7a, 7b on the upstream zone 10b side and in the downstream zone 10c so that the processes carried out by these members and by those placed in the intermediate zone 10a, can all be performed simultaneously. In other words, when the wires 7a, 7b are driven by the supply, guide and storage members 9a, 9 and 9b, to be moved by a length portion corresponding to the spacing between two chips, the additional members are positioned opposite a chip (downstream of the intermediate insertion zone) or opposite a longitudinal section of wire (upstream of this zone) that they can process. When all the processes have been carried out by these members, the wires 7a, 7b can be driven and moved by an additional length portion.

In an alternative embodiment of the present disclosure, the wires 7a, 7b can be continuously driven, in order to further increase the working rate. In this case, the chip 1 can be positioned on a plate moving in the wire driving direction and at the same speed so that the chip 1 is substantially stationary relative to the wires 7a, 7b, and allow the insertion thereof into the grooves 2a, 2b and the assembly thereof.

First Example

The above described method and piece of equipment 8 can be used to produce a transmission reception device 15 and a chain of such devices, as described in document U.S. Pat. No. 8,471,773.

Such a transmission reception device 15 is formed by a chip 1 according to the one shown in FIG. 1a, comprising two longitudinal grooves 2a, 2b arranged on opposite sides of the chip 1. Two conductive wires 7a, 7b are placed in the grooves 2a, 2b. These wires extend on either side of the chip 1 to form a dipole-shaped antenna. The wires 7a, 7b are electrically connected to terminals 4a, 4b of a transmission reception circuit 4, positioned, for example, in the substrate 3 of the chip 1. FIG. 4a shows a schematic representation of such a transmission reception device 15.

For reasons of mechanical resistance, in particular, to bending, the wire is preferably chosen in stainless steel. In some cases, however, copper-based alloy or copper wires may be preferred.

To manufacture such a transmission reception device, or a chain of such devices, two wire coils are placed in the unwinders of the positioning members 9a, and these wires 7a, 7b are deployed through the positioning members 9 until they are attached to the storage spool of the reel forming the positioning member 9b. Once positioned, the different positioning members are activated to position the wires in a state of tension and in the same plane to prepare the insertion of the wires 7a, 7b into the chips 1. Transmission reception chips 1, for example, RFID chips, are positioned in the chip storage zone and can be successively moved, during the processing sequences, to the insertion position by the handling device 11. During each new processing sequence, the members that the piece of equipment 8 is made of simultaneously perform the following operations, before moving the wire by a specified length and repeating these operations again.

In the upstream zone 10b of the workspace, at an additional member 14:
cleaning, and possibly tin-plating a longitudinal section of the wires 7a, 7b intended to be accommodated in the grooves 2a, 2b of a chip 1.

In the intermediate zone 10a, using the members located in this zone:
removing a chip 1 from the storage area and positioning this chip 1 in the insertion position;
inserting the longitudinal sections of the wires 7a, 7b that have been previously prepared during a previous sequence; and
assembling the wires 7a, 7b in the grooves 2a, 2b by liquefying and solidifying the bonding material initially forming the pads 6a, 6b.

In the downstream zone 10c, using additional members 14 arranged in this zone opposite a plurality of chips 1 assembled to the wires 7a, 7b during previous sequences:
dispensing an adhesive into the grooves 2a, 2b and on the longitudinal sections of the wires exposed in these grooves and exposure of the adhesive to harden it and reinforce the assembly of the wires 7a, 7b on the chip 1;
cutting one of the two wires 7a, 7b in order to preform dipole-shaped antennas;
encapsulating the chip 1 in a protective material such as a rigid resin, allowing it to be mechanically and chemically protected; and
functional testing of the chip 1, and programming the chip 1 to assign it a unique identification number.

It should be noted that dispensing an adhesive into the grooves 2a, 2b and on the longitudinal sections of the wires can lead to the formation of an adhesive meniscus between the wire and one edge of the chip, perpendicular to the wire. This meniscus helps to make the assembly of the chip and the wires 7a, 7b particularly resistant to the forces that could be applied to the wires and that would tend to disengage them from the chip.

Upon completion of the manufacturing process, a storage coil is obtained, comprising a chain 16 of transmission reception devices 15, as shown schematically in FIG. 4b. Segments forming a functional transmission reception device 15 that can be integrated into an object, for example, for identification purposes, can be taken from this chain 16.

As shown in FIG. 4a, each transmission reception device 15 of the chain 16 comprises a chip 1 having two longitudinal grooves 2a, 2b parallel to each other and arranged on two opposite sides of the chip 1. The transmission reception device also includes a functional transmission reception circuit 4, and two wire segments 7a, 7b accommodated in the grooves 2a, 2b and spreading out each from one side of a groove 2a, 2b to form a dipole-shaped antenna. The wire segments 7a, 7b are in electrical contact with terminals 4a, 4b of the functional circuit 4, arranged in the groove, via a bonding material 17. The wire segments are also maintained in the grooves 2a, 2b by one adhesive 18 positioned in these grooves 2a, 2b and on the exposed side of the wires 7a, 7b. The chip 1 is also coated and encapsulated in a protective material 19.

Second Example

This second example relates to a transmission reception device 20, similar to the one of the first example. In this second example, however, shown schematically in FIG. 5a, the transmission reception device 20 has an antenna with a loop, formed by electrically connecting one end of one wire 7b to the other wire 7a. To manufacture this device, a manufacturing process similar to the one of the preceding example is used. During each new processing sequence, the members that the piece of equipment 8 is made of simultaneously perform the following operations, before moving the wire by a set length and repeating these operations again.

In the upstream zone 10b of the workspace, at an additional member 14:
cleaning, and possibly tin-plating a longitudinal section of the wires 7a, 7b intended to be accommodated in the grooves 2a, 2b of a chip 1.

In the intermediate zone 10a, using the members located in this zone:
removing a chip 1 from the storage zone and positioning this chip 1 in the insertion position;
inserting the longitudinal sections of the wires 7a, 7b that have been previously prepared during a preceding sequence; and
assembling the wires 7a, 7b in the grooves 2a, 2b by liquefying and solidifying the bonding material initially forming the pads 6a, 6b.

In the downstream zone 10c, using additional members 14 arranged in this zone opposite a plurality of chips 1 assembled to the wire 7a, 7b during preceding sequences:

dispensing an electrically insulating material at least on the two wires 7a, 7b arranged on one side of the chip to avoid putting them in electrical contact over a set distance. The insulation can also be dispensed on the chip;

Optionally, at the end of the insulating zone that has been formed or prior to this insulation step, bringing the two wires 7a, 7b into electrical contact, for example, by moving them closer together using movable jaws similar to the positioning members 12 of the intermediate zone and welding them together. Alternatively, it may be planned to dispense a conductive glue or any other conductive material on and between the two wires 7a, 7b in order to establish this electrical contact. A loop is thus formed. If this operation is not carried out, the formation of the loop can be obtained later, after removing a segment of the storage coil, before the device is integrated into an object;

encapsulation of the chip 1 in a protective material such as a rigid resin, allowing it to be mechanically and chemically protected. This encapsulation step can be omitted when an electrically insulating material has been previously dispensed on the chip and the wires;

cutting one of the wires along the chip 1, for example, by forming a notch (laser cut) 22 in the encapsulation layer deep enough to cause the wire to break locally; and operational testing of the chip 1, and programming of the chip 1 to assign it a unique identification number.

In this second example, it is not necessary to cut a segment of wire to form the antenna. A chain 21 composed of two wires 7a, 7b on which the chips 1 are assembled is preserved. Segments forming an operational transmission reception device can be removed from the device chain that is formed according to the method described above, wherein, like the previous example, an object can be integrated in order to identify same. This chain 21 is schematically shown in FIG. 5b.

As shown in FIG. 5c, each transmission reception device 20 includes a chip 1 with two longitudinal grooves 2a, 2b parallel to each other and arranged on two opposite sides of the chip 1. The transmission reception device also includes an operational transmission reception circuit 4, and two wire segments 7a, 7b accommodated in the grooves 2a, 2b. It also includes two wire segments 7a, 7b accommodated in the grooves 2a, 2b and spreading out on either side of these grooves 2a, 2b. The wires 7a, 7b can be in contact with each other on one side of the chip 1 to form a loop and the longitudinal section of the wires accommodated in the grooves 2a, 2b is in electrical contact with the terminals 4a, 4b of an operational circuit 4 arranged in the grooves 2a, 2b via a bonding material 17. The wire segments constituting the loop, and possibly the chip, can be at least partially embedded in an electrically insulating material 23, thus avoiding electrical contact between same. The chip 1 is embedded and encapsulated in a protective material 19, especially when it has not been embedded in the insulating material. The encapsulation material(s) has/have a notch 22 that has been used to cut one of the wires to make the antenna functional.

The transmission reception device 15, 20 of the first and second examples can be inserted into a textile thread, for example, by taping, as taught in document U.S. Pat. No. 8,814,054. More generally, it can be inserted into a textile or plastic material, a fabric or a sheath.

Thus, the textile thread or segments of this thread including the transmission reception device, or more generally the textile or plastic material, the fabric or the sheath in which the device has been inserted, can itself be integrated into an object, whether textile or not.

Of course, the present disclosure is not limited to the mode of implementation described and alternative embodiments can be provided without going beyond the scope of the present disclosure as defined by the claims.

The invention claimed is:

1. A method for inserting a wire into a longitudinal groove of a semiconductor chip, comprising:
   providing an assembly including the semiconductor chip with the longitudinal groove, the longitudinal groove containing a pad made of a bonding material having a melting point;
   providing the wire;
   positioning a longitudinal section of the wire along the longitudinal groove in abutment against the pad; and
   heating at least one portion of the pad to a processing temperature higher than the melting point of the bonding material and at least partially melting the pad, and thus provoking the insertion of the wire into the groove, wherein the pad, prior to the melting of the pad, occupies a sufficient portion of the groove to prevent the wire from being entirely accommodated therein.

2. The method of claim 1, further comprising:
   providing at least one additional semiconductor chip having a longitudinal groove containing a pad made of a bonding material having a melting point;
   positioning another longitudinal section of the wire along the groove of the at least one additional semiconductor chip in abutment against the pad of the at least one additional semiconductor chip; and
   heating at least one portion of the pad of the at least one additional semiconductor chip to a processing temperature higher than the melting point of the bonding material and for a sufficient time to at least partially melt the pad of the at least one additional semiconductor chip, and inserting the wire into the groove of the at least one additional semiconductor chip.

3. The method of claim 1, further comprising solidifying the bonding material to assemble the wire and the semiconductor chip after inserting the wire into the groove.

4. The method of claim 1, further comprising maintaining the wire in a state of tension while inserting the wire into the groove, and wherein positioning the longitudinal section of the wire along the groove in abutment against the pad further comprises pressing the wire against the pad.

5. The method of claim 1, wherein heating the at least one portion of the pad to the processing temperature comprises exposing the at least one portion of the pad to a hot air flow or heating the at least one portion of the pad by induction.

6. The method of claim 1, further comprising preparing the longitudinal section of the wire to be inserted into the groove before or during the positioning of the longitudinal section of the wire along the groove.

7. The method of claim 6, wherein preparing the longitudinal section of the wire comprises depositing a coating layer on the longitudinal section of the wire.

8. The method of claim 6, wherein preparing the longitudinal section of the wire comprises a step of cleaning and/or deoxidation of the longitudinal section of the wire.

9. The method of claim 1, further comprising dispensing an adhesive into the groove and on the longitudinal section of the wire exposed in the groove after positioning the longitudinal section of the wire along the groove.

10. The method of claim 1, further comprising encapsulating the chip and/or at least a portion of the wire after inserting the wire into the groove.

11. The method of claim 1, wherein the wire is electrically conductive.

\* \* \* \* \*